United States Patent [19]
Fisher

[11] Patent Number: 6,003,154
[45] Date of Patent: Dec. 14, 1999

[54] SYSTEM AND METHOD FOR COVERING ILLEGAL STATES IN A PROGRAMMABLE GATE ARRAY

[75] Inventor: Kent E. Fisher, Rowlett, Tex.

[73] Assignee: Nortel Networks Corporation, Montreal, Canada

[21] Appl. No.: 08/856,092

[22] Filed: May 14, 1997

[51] Int. Cl.$^6$ ............................. G06F 11/00; G06F 11/10
[52] U.S. Cl. ......................... 714/806; 714/809; 714/811; 714/49; 714/52; 395/185.02; 395/185.05
[58] Field of Search ........................ 395/182.08, 185.02, 395/185.05; 371/68.1, 48–71; 714/806, 809, 811, 49, 52

[56] References Cited

U.S. PATENT DOCUMENTS

| | | | |
|---|---|---|---|
| 3,744,024 | 7/1973 | Russell et al. | 340/146.1 |
| 3,779,458 | 12/1973 | Chang et al. | 235/153 |
| 4,233,682 | 11/1980 | Liebergot et al. | 371/68 |
| 4,833,677 | 5/1989 | Jarwala et al. | 371/21 |
| 4,920,497 | 4/1990 | Upadhyaya et al. | 364/491 |
| 5,596,716 | 1/1997 | Byers et al. | 395/185.01 |
| 5,655,069 | 8/1997 | Ogawara et al. | 395/182.08 |

OTHER PUBLICATIONS

Microsoft Press, Computer Dictionary, 3rd Edition, 1997, pp. 215 and 194.

Primary Examiner—William Grant
Assistant Examiner—Iván Calcaño
Attorney, Agent, or Firm—Bruce Garlick

[57] ABSTRACT

A programmable gate array (PGA) according to the present invention includes a plurality of state machine logic blocks and a plurality of error detecting logic blocks. Each state machine logic block of the plurality of state machine logic blocks produces a respective state with the plurality of state machine logic blocks in combination producing a system state. The plurality of state machine logic blocks are interconnected to execute logic programmed logic functions, such functions employed by a system within which the PGA resides. The error detecting logic blocks are interconnected to detect errors in the system state and to produce an error signal upon detection of an error in the system state. The error signal serves to reset operation of the plurality of state machine logic blocks. The plurality of state machine logic blocks may be one-hot encoded wherein, during non-error states, only one of the states produced by the plurality of state machine logic blocks is logic high. In such case, the plurality of error detecting logic blocks detects an error in the system state when more than one of the states produced by the plurality of state machine logic blocks is logic high or when none of the plurality of state machine logic blocks is in a logic high state. In producing the error signal, the plurality of error detecting logic blocks may be connected in a multi-level hierarchy.

20 Claims, 6 Drawing Sheets

SYSTEM AND METHOD FOR COVERING ILLEGAL STATES IN A PROGRAMMABLE GATE ARRAY

BACKGROUND

1. Technical Field

This invention relates generally to digital circuitry and more particularly to a system and associated method of operation in a programmable gate array for detecting error conditions in the programmable gate array, the system and associated method providing high speed error detection with minimized overhead.

2. Related Art

The use of state logic within digital systems is well known. Many modern integrated circuits use some form of state logic to execute their specific functions. Circuitry using state logic includes, for example, microprocessors, digital signal processors, application specific integrated circuits, micro-controller units and various other digital circuits. State logic typically includes state machines and combining logic. State machines may include registers, latches and other circuits employed to represent one or more state bits. The combining logic interconnects the state machines and intercouples inputs to execute desired state machine logic. External inputs are provided to the combining logic per a state machine logic design while outputs are derived from the state bits and output per the state machine logic design.

In many applications, for example in the communications industry, programmable gate arrays are used within communication system elements to execute particular state machine logic. In many applications, the programmable gate arrays are field programmable so that they may be easily reprogrammed as required. Field programmable gate arrays ("FPGAs") are used in, for example, switching systems, switching equipment, mobile terminals, radio control circuitry, and various other elements that may reside within such communication systems.

Figure 1:
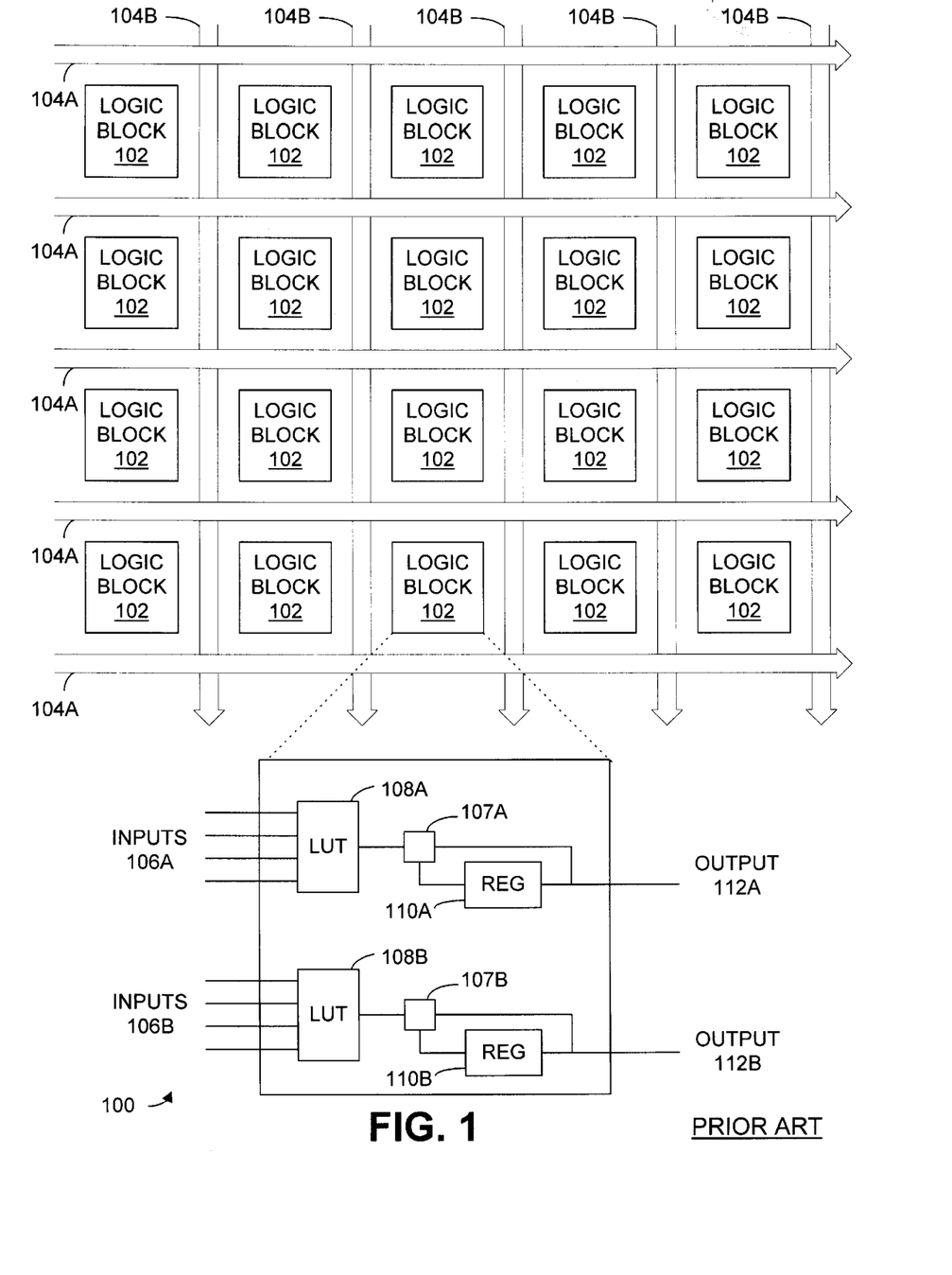
FIG. 1 is a block diagram illustrating a portion of a prior art programmable gate array (PGA)

FIG. 1 generically illustrates a FPGA 100 that may be employed within various communication system elements. The FPGA 100 includes a plurality of logic blocks 102 connected via routing resources 104A and 104B to, in combination, execute programmed logic, which may include state machine logic. Each of the logic blocks 102 receives inputs 106A and 106B and produces outputs 112A and 112B. The inputs 106A and 106B may be either inputs received externally from the FPGA 100 or outputs of other logic blocks 102. Further, outputs 112A and 112B may be outputs provided external to the FPGA 100 or provided as inputs to other logic blocks 102.

Each of the logic blocks 102 may include, for example, lookup tables (LUTs) 108A and 108B and registers 110A and 110B. Each of the registers 110A and 110B produces one or more state bits. In combination, these state bits represent a state of the logic block 102 while, in combination, the states of the logic blocks 102 produce a system state. The LUTs 108A and 108B receive the inputs 106A and 106B, respectively, and execute logic functions to produce either inputs to the registers 110A and 110B or the outputs 112A and 112B, based upon the programming of the multiplexing elements 107A and 107B. Programmed in a bypass mode, the multiplexing elements 107A and 107B bypass outputs from the LUTs 108A and 108B to the outputs 112A and 112B. In such a bypass mode, the logic block 102 executes only combinational logic without producing state bits. In a non-bypass mode, outputs from the LUTs 108A and 108B route via the multiplexing elements 107A and 107B to the registers 110A and 110B to produce the state bits. The LUTs 108A and 108B, the multiplexing elements 107A and 107B and the routing resources 104A and 104B are programmed at startup or reset so that the FPGA 100 performs a desired logic operation which may include state machine logic operation. Due to its reprogrammable construction, the FPGA 100 may be reprogrammed as required without removing the FPGA 100 from its host system.

During normal operations, the FPGA 100 executes it programmed state machine logic without error. However, in the presence of noise and other system anomalies, operation of the FPGA 100 may become disrupted. During such disruption, the FPGA 100 may enter an erroneous system state. Such erroneous system state causes the outputs 112A and 112B produced by the FPGA to also be erroneous, potentially disrupting operation of the host system. Thus it is desirable to determine when an erroneous state or states are entered by the FPGA so that the FPGA may be reset to a known valid state and to commence operation therefrom.

Some prior art FPGAs incorporated error detection methodologies that were incorporated into the state machine logic. However, these FPGAs used a binary encoded method for implementing the state machine logic, such programming being inherently slow. Thus, with the error detection functions, the FPGAs failed to provide satisfactory performance.

Thus, in speed sensitive applications, FPGAs may be programmed to implement state machine logic using one-hot encoding. In one-hot encoding, the plurality of logic blocks 102 operate in cooperation such that only a single one of the state bits of the system state is logic high at any time. Further, in one-hot encoded operation, the overall speed of operation of the FPGA increases significantly as compared to the speed of binary encoded state machine logic implemented in FPGAs. However, in one-encoding, the number of erroneous states, as compared to the number of erroneous states in a binary encoded state machine, increases significantly. For example, in a ten state programmable gate array, there are 1,014 undefined states. To detect such large number of undefined states using conventional techniques wherein error logic is programmed along with operating logic would decrease the speed of operation to such an extent so as to defeat the purpose of one-hot encoding.

Thus, there is a need in the art for a system and associated methodology that expeditiously determines whether a one-hot programmed gate array and other gate arrays is properly operating and to initiate a reset upon detection of an erroneous operating condition.

SUMMARY OF THE INVENTION

A programmable gate array (PGA) according to the present invention includes a plurality of state machine logic blocks and a plurality of error detecting logic blocks. Each state machine logic block of the plurality of state machine logic blocks produces a respective state with the plurality of state machine logic blocks in combination producing a system state. The plurality of state machine logic blocks are interconnected to execute programmed logic functions, such functions employed by a host system within which the PGA resides. Each of the state machine logic blocks may include one or more look-up tables (LUTs), one or more registers and connectivity therebetween. The LUTs, the registers and the connectivity are programmed to cause the respective state machine logic block to execute the programmed logic functions.

Each of the plurality of error detecting logic blocks receives as an input one of the states produced by the plurality of state machine logic blocks. The error detecting logic blocks are interconnected to detect errors in the system state and to produce an error signal upon detection of an error in the system state. Each of the error detecting logic blocks may include one or more LUTs, one or more registers and connectivity therebetween. The LUTs, the registers and the connectivity are programmed to cause the error detecting logic blocks to produce the error signal upon detection of an error in the system state. In one embodiment of the present invention, the error signal serves to reset operation of the plurality of state machine logic blocks In one embodiment of the PGA according to the present invention, the plurality of state machine logic blocks are one-hot encoded wherein, during non-error states, only one bit of the states produced by the plurality of state machine logic blocks is logic high. In such case, the plurality of error detecting logic blocks detects an error in the system state when more than one of the states produced by the plurality of state machine logic blocks is logic high or when none of the plurality of state machine logic blocks is in a logic high state.

In producing the error signal, the plurality of error detecting logic blocks may be connected in a multi-level hierarchy. In one embodiment of such a multi-level hierarchy, the plurality of error detecting logic blocks includes a first, a second and a third group of error detecting logic blocks. The first group of error detecting logic blocks receives the states produced by the plurality of state machine logic blocks, while the second group of error detecting logic blocks receives outputs produced by the first group of error detecting logic blocks and the third group of error detecting logic blocks receives outputs produced by the second group of error detecting logic blocks and produces the error signal.

PGAs according to the present invention may be incorporated into communication system elements. In one embodiment, the PGAs comprise field programmable gate arrays (FPGAs) that are programmed to facilitate changes in operating conditions and user defined functions. Such FPGAs may operate in accordance with the present invention to provide higher speed operation while functioning to detect erroneous states and resetting upon such detection.

A method according to the present invention includes programming a first portion of the plurality of logic blocks as state machine logic blocks and programming a second portion of the plurality of logic blocks as error detecting logic blocks, each state produced by the plurality of state machine logic blocks is provided as an input to the plurality of error detecting logic blocks, the error detecting logic blocks interconnected to detect errors in the system state.

Moreover, other aspects of the present invention will become apparent with further reference to the drawings and specification which follow.

DETAILED DESCRIPTION OF THE DRAWINGS

Figure 2:
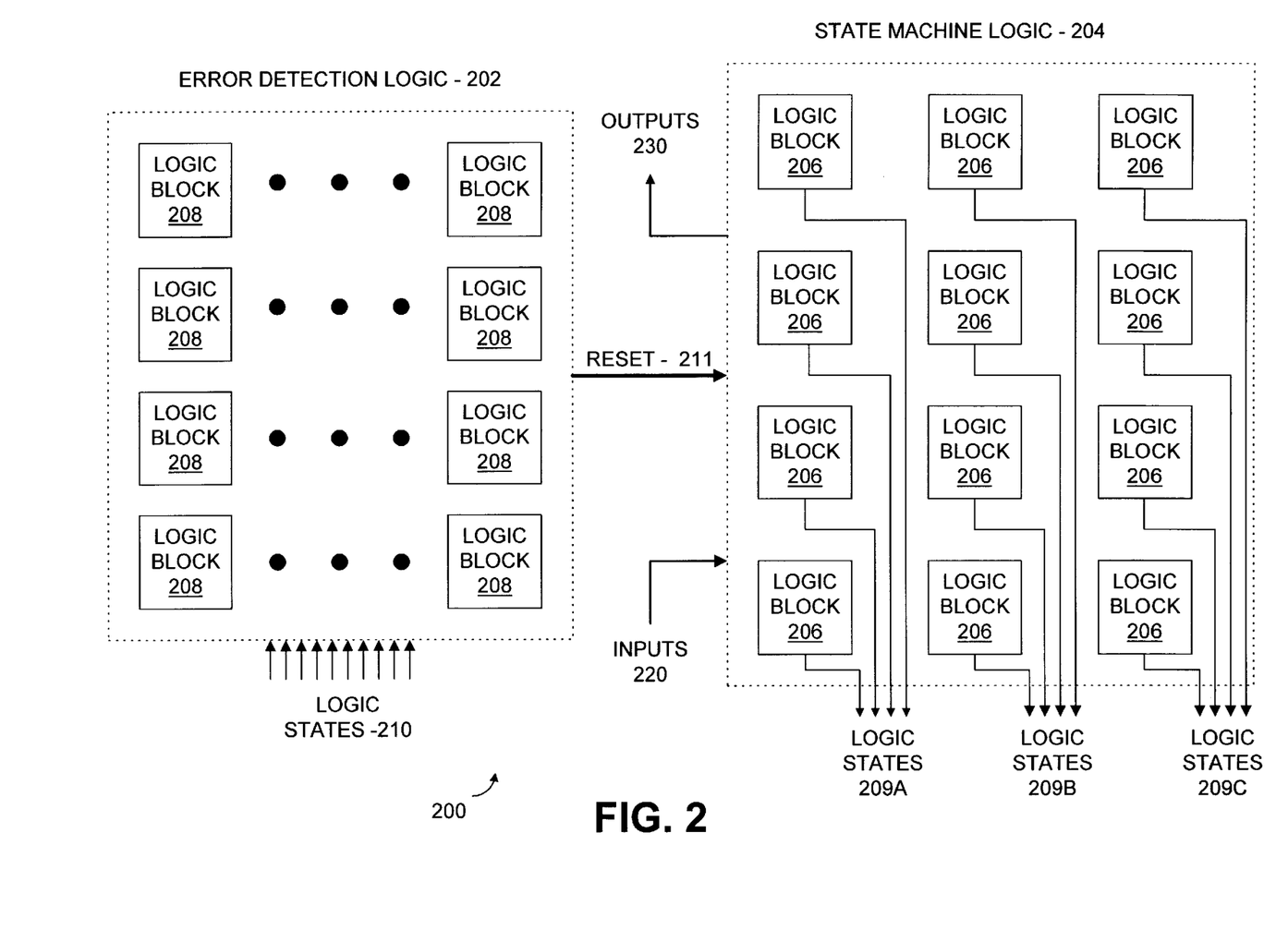
FIG. 2 is a block diagram illustrating a portion of a PGA implementing state machine logic as well as error detection logic according to the present invention.

FIG. 2 illustrates a portion of a programmable gate array (PGA) 200 that includes error detection logic 202 and state machine logic 204 according to the present invention. The PGA 200 could comprise a standard PGA or a field programmable gate array (FPGA). The state machine logic 204 includes a plurality of logic blocks 206 that receive inputs 220 and produce outputs 230 based upon the inputs 220 and logic states 209A–209C produced by the logic blocks 206. Such state machine logic 204 may provide functionality for a host system within which the PGA 200 resides. Such host system may include a communication system element such as a base station transceiver, a base switching center, a mobile switching center, a mobile transceiving unit, a mobile telephone, or any various other component that may be found in a communications system. Because the programming and operation of PGAs is generally known, the programming and operation of a PGA according to the present invention is discussed herein only to expand upon the teachings of the present invention.

The state machine logic 204 includes the plurality of logic blocks 206, each of which produces one or more state bits. The state bits produced by the state machine logic 204 are referenced as the logic states. Combined, the logic states 209A–209C represent the system state of the PGA 200. Each of the logic states 209A–209C may serve as an output 230 of the PGA 200 or may serve as an intermediate signal used as an input to another one of the logic blocks 206. When the state machine logic 204 includes twelve (12) state bits, for example, and configured in a one-hot encoded method, the state machine logic 204 could represent $2^{12}$ unique states using conventional programming techniques. In such a system, error checking logic would be programmed into the state machine logic 204 by configuring look-up tables, multiplexors and registers within each of the logic blocks 206. However, even in a PGA 200 having only 12 state bits, conventional error checking logic would significantly slow the operation of the PGA 200.

According to the present invention, the error detection logic 202 receives the logic states 210 (in one embodiment, logic states 210 are equivalent to logic states 209A, 209B and 209C) and produces a reset signal 211 based upon the logic states 210. The logic blocks 208 are interconnected to receive the logic states 210 and process the logic states 210 to produce the reset signal 211. Such connectivity will be described further herein.

When the state machine logic 204 is programmed as a one-hot encoded state machine, only a single one of the bits of the logic states 209A–209C is logic high in any valid system state. When more than one of the bits of the logic states 209A–209C is logic high or when none of the bits of the logic states 209A–209C is logic high, the state machine logic 204 is in an erroneous state. Thus, in the one-hot encoded embodiment, the error detection logic 202 produces the reset signal 211 when detecting more than one logic high or no logic highs. Thus, the error detection logic 202 according to the present invention detects errors in the state bits of the system state of the state machine logic 204 and generates the reset 211 signal when the system state is erroneous. The error detection logic 202 includes a plurality of error detection blocks 208 that, in combination, generate the reset signal 211 which is fed back to the state machine logic 204 to reset the logic blocks 206 of the state machine logic 204.

According to the present invention, the PGA 200 may include a plurality of logic blocks with the plurality of state machine logic blocks 206 comprising a first portion of the logic blocks and the error detection logic blocks 208 comprising a second portion of the logic blocks. Thus, the logic blocks making up the error detection logic 202 and the state machine logic 204 may include similarly constructed logic blocks but that are programmed for their particular functions. Programming of the logic blocks to execute their particular functions includes the programming of look-up-tables (LUTs) within the logic blocks, programming of multiplexing elements within the logic blocks and programming of interconnectivity between the logic blocks. Thus, the teachings of the present invention may be applied to specifically program PGAs to execute both logic functions and error detection functions. As compared to prior techniques, the error detection logic 202 expeditiously determines whether an error condition exists in the state machine logic 204 without degrading performance of the programmable gate array. As will be further described herein, the error detection logic 202 is advantageously implemented based upon the particular construction of the PGA 200 within which it is implemented so as to cause the error detection logic 202 to operate at least as fast as the state machine logic 204. By implementing the error detection logic 202 in such a fashion, error states are determined and the reset signal 211 is generated immediately upon entry into an erroneous state.

As applied to the FPGA 100 illustrated in FIG. 1A, the reset signal 211 may serve as an input to one or more of the LUTs 108A-108B or one or more of the registers 110A-110B, so as to reset the system state of the FPGA. The reset signal 211 may be configured in various manners to reset operation of the FPGA 100 upon detection of an erroneous system state depending upon a particular implementation. In still further embodiments of the present invention, the reset signal 211 could initiate reloading of program logic from a separate memory within a larger system.

Figure 3:
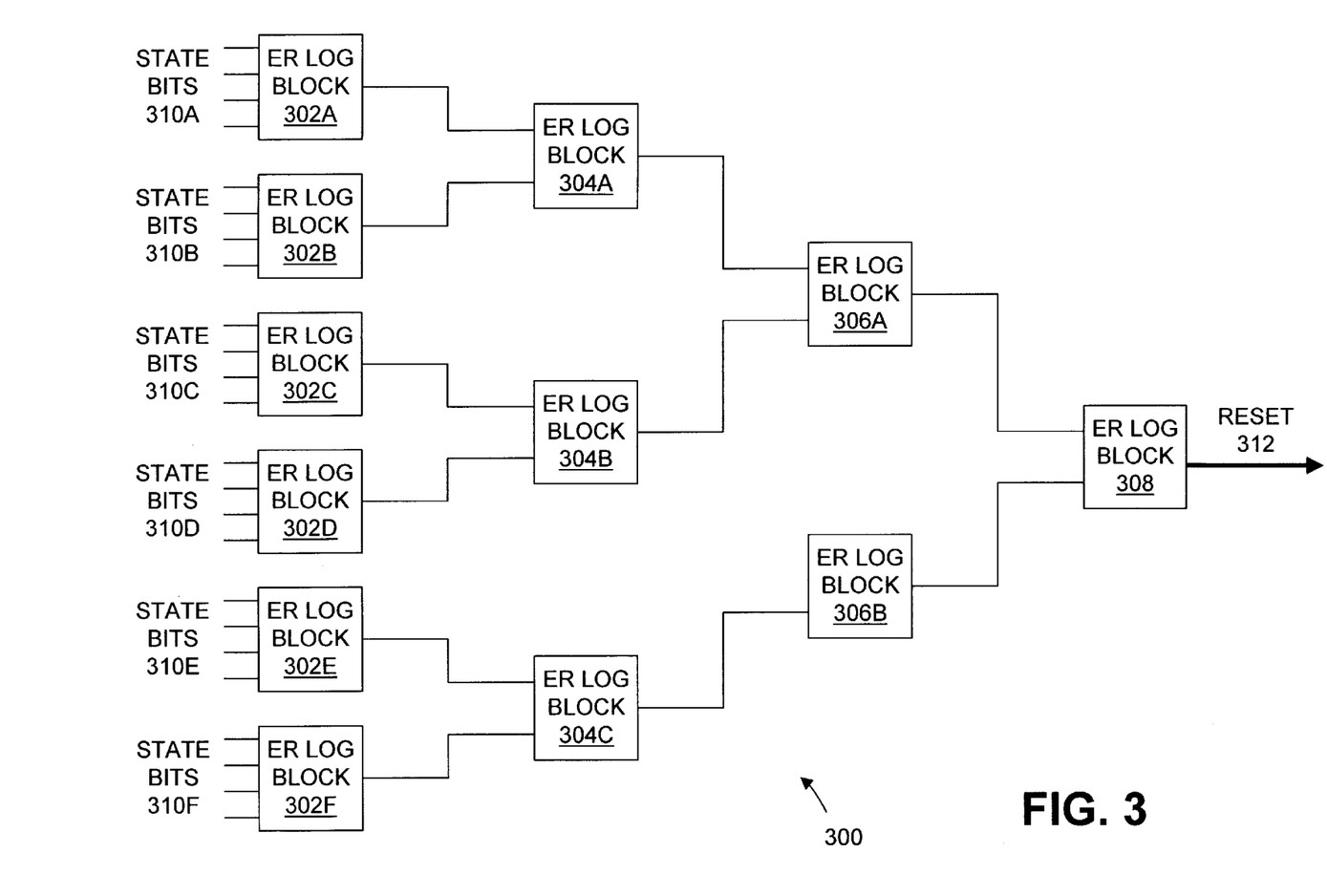
FIG. 3 is a block diagram illustrating in more detail the error detection logic of FIG. 2 that generates a reset signal upon detection of an error state in a one-hot encoded PGA.

FIG. 3 illustrates a particular implementation of the error detection logic 202 of FIG. 2 in generating a reset signal 312 based upon logic states or state bits 310A–310F. In the particular implementation of the error detection logic 202, a hierarchy is employed in conjunction with the error logic blocks to generate the reset signal 312. At a first level in the hierarchy, a first plurality of logic blocks, error detection blocks 302A–302F, receive the state bits 310A–310F. The number of state bits 310A–310F received by each error detection block 302A–302F of the state machine logic 204 depends upon the particular implementation. For illustrative purposes, four state machine bits are shown as received by each error detection logic block 302A–302F. Of course, in other implementations, efficiency considerations may require that fewer than four or more than four state machine bits be received by each error detection logic block 302A–302F.

Each of the error detection logic blocks 302A–302F generates an output, with each output received by an error detection logic block 304A–304C at a second level of the hierarchy. Further, each of the outputs generated by error detection logic blocks 304A–304C at the second level of the hierarchy is received by error detection logic block 306A–306B at a next higher hierarchical level. Finally, an error detection logic block 308 at a next higher hierarchical level receives outputs from hierarchical blocks 306A and 306B and generates the reset signal 312. Such reset signal 312 is provided to the state machine logic 204 as illustrated previously with respect to reset signal 211 of FIG. 2.

In one embodiment, the reset signal 312 is provided as an asynchronous reset input to each of the logic blocks 206 of the state machine logic 204. In such case, the reset signal 312 is latched in error detection logic block 308 and held until the state machine logic 204 has reset. In another embodiment, the reset signal 312 is passed as an input 220 to the state machine logic 204, such input triggering the reset condition for the state machine logic 204.

The error detection logic blocks 302A–302F, 304A–304C, 306A-306B and 308 may be viewed as performing operations within the hierarchy. Each of the error detection logic blocks may include generic logic blocks that have been programmed to perform the error detection functions or may be include logic blocks constructed particularly to perform the error detection functions. Within the hierarchy, a first plurality of logic blocks 302A–302F receives the state bits 310A–310F while a second plurality of the logic blocks 304A–304C and 306A-306B execute intermediate functions and a third plurality of logic blocks 308 produce the reset signal 312. As is evident, the number of hierarchy levels, and the number of logic blocks required to execute the error detection functions, depends upon the number of state bits 310A–310F received and the number of inputs receivable by each logic block. In such implementations where logic blocks receive larger numbers of inputs, fewer logic blocks are required to execute the error detection functions of the error detection logic.

In one embodiment of a PGA according to the present invention, each of the error detection logic blocks 302A–302F, 304A–304C, 306A-306B and 308 executes combinational logic without producing states. Thus, in the embodiment, registers or flip-flops that would otherwise implement states are bypassed or not included within the error detecting logic blocks. However, in other embodiments, states may be employed in detecting errors in the system state with the registers or flip-flops used accordingly.

Figure 4A:
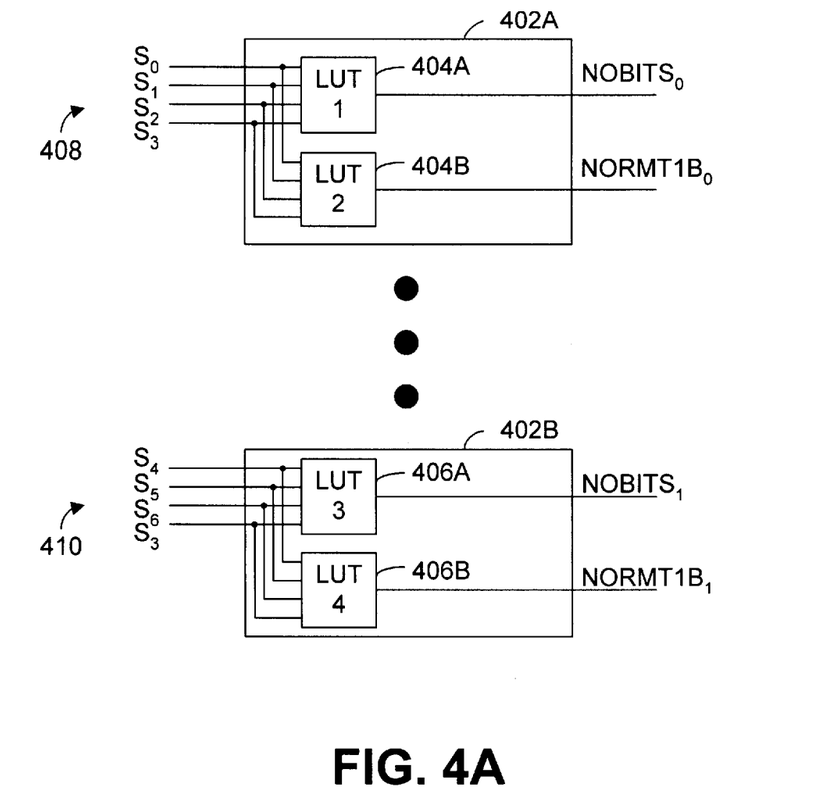
FIGS. 4A and 4B are block diagrams generally illustrating the connectivity of error logic blocks of the error detection logic employed to generate the reset signal.
Figure 4B:
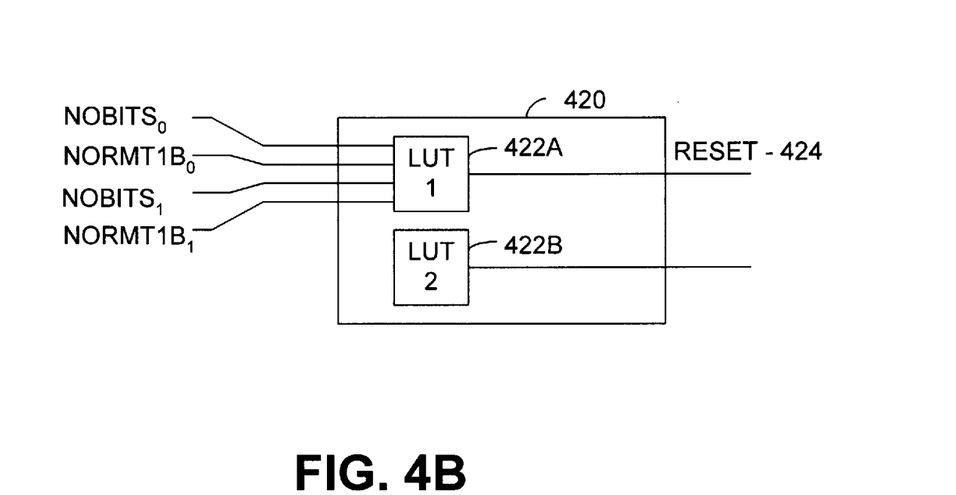

FIGS. 4A and 4B illustrate particular implementations of the combinational logic executed by the error detection logic blocks illustrated in FIG. 3. With particular reference to FIG. 4A, a first error detection logic block 402A and a second error detection logic block 402B receive state machine bits 408 and state machine bits 410, respectively. Error detection logic block 402A includes first lookup table 404A and second lookup table 404B. The following exemplary code segment illustrates logic executed by lookup tables 404A and 404A and programming required for error detecting logic.

CODE SEGMENT module test title 'One-Hot Encoding Test'

"The file covers the undefined states for a 16 state one-hot

"encoded state machine

"inputs s1, s2, s3, s4, s5s, s6, s7, s8, s9, s10, s11, s12, s13, s14, s15, s16 pin;

"outputs nobits1, normt1, nobits2, normt1b2, nobits3, normt1b3, nobits4, normt1b4, smrst pin;

| | |
|---|---|
| nobits1 | istype 'com'; |
| nobits2 | istype 'com'; |
| nobits3 | istype 'com'; |
| nobits4 | istype 'com'; |
| normt1b1 | istype 'com'; |
| normt1b2 | istype 'com'; |
| normt1b3 | istype 'com'; |
| normt1b4 | istype 'com'; |
| smrst | istype 'com'; |

Equations

"The nobits equation determine if none of the state bits are set nobits1=(!s1 & !s2 & !s3 & !s4);

nobits2=(!s5 & !s6 & !s7 & !s8);

nobits3=(!s9 & !s10 & !s11 & !s12);

nobits4=(!s13 & !s14 & !s15 & !s16);

"The normt1b (none or more than one bit) equation determine

"if no bits or more than one bit is set normt1b1=!((s1 & !s2 & !s3 & !s4)# (!s1 & s2 & !s3 & !s4) #(!s1 & !s2 & s3 & !s4)#(!s1 & !s2 & !s3 & s4));

normt1b2=!((s5 & !s6 & !s7 & !s8)#(!s5 & s6 & !s7 & !s8) #(!s5 & !s6 & s7 & !s8)#(!s5 & !s6 & 1s7 & s8));

normt1b3=!((s9 & !s10 & !s11 & !s12)#(!s9 & s10 & !s11 & !s12) #(!s9 & !s10 & s11 & !s12)#(!s9 & !s10 & !s11 & s12));

normt1b4=!((s13 & !s14 & !s15 & !s16)#(!s13 & s14 & !s15 & !s16) #(!s13 & !s14 & s15 & !s16)#(!s13 & !s14 & !s15 & s16));

"The smrst equation is used to synchronously reset the state "machine. It consists of an equation to detect if more than one bit "is set in a four state block, an equation to detect if none of "the state bits are set, and equation to detect if a bit is set "in more than one of the four state blocks.

smrst = ( normt1b1 & !nobits1 ) # ( normt1b2 & !nobits2 )
    # ( normt1b3 & !nobits3 ) # ( normt1b4 & !nobits4 )
    # ( nobits1 & nobits2 & nobits3 & nobits4 )
    # ! ( ( !normt1b1 & !nobits1 ) & ! ( !normt1b2 & !nobits2 )
        & ! (!normt1b3 & !nobits3 ) & ! ( !normt1b4 & !nobits4 )
    # ! ( !normt1b1 & !nobits1 ) & ( !normt1b2 & !nobits2 )
        & ! ( !normt1b3 & !nobits3 ) & ! ( !normt1b4 & !nobits4 )
    # ! ( !normt1b1 & !nobits1 ) & ! ( !normt1b2 & !nobits2 )
        & ( ! normt1b3 & !nobits3 ) & ! ( !normt1b4 & !nobits4 )
    # ! ( !normt1b1 & !nobits1 ) & ! ( !normt1b2 & !nobits2 )
        & ! ( !normt1b3 & !nobits3 ) & ! ( !normt1b4 & !nobits4 ) ) ;

Test_Vector 'Test defined and undefined states'

| [s1, | s2, | s3, | s4, | s5, | s6, | s7, | s8, | s9, | s10, | s11, | s12, | s13, | s14, | s15, | s16]->[smrst]) |
|---|---|---|---|---|---|---|---|---|---|---|---|---|---|---|---|
| [ 1, | 0, | 0, | 0, | 0, | 0, | 0, | 0, | 0, | 0, | 0, | 0, | 0, | 0, | 0, | 0]-> [0]; |
| [ 0, | 1, | 0, | 0, | 0, | 0, | 0, | 0, | 0, | 0, | 0, | 0, | 0, | 0, | 0, | 0]-> [0]; |
| [ 0, | 0, | 1, | 0, | 0, | 0, | 0, | 0, | 0, | 0, | 0, | 0, | 0, | 0, | 0, | 0]-> [0]; |
| [ 0, | 0, | 0, | 1, | 0, | 0, | 0, | 0, | 0, | 0, | 0, | 0, | 0, | 0, | 0, | 0]-> [0]; |
| [ 0, | 0, | 0, | 0, | 1, | 0, | 0, | 0, | 0, | 0, | 0, | 0, | 0, | 0, | 0, | 0]-> [0]; |
| [ 0, | 0, | 0, | 0, | 0, | 1, | 0, | 0, | 0, | 0, | 0, | 0, | 0, | 0, | 0, | 0]-> [0]; |
| [ 0, | 0, | 0, | 0, | 0, | 0, | 1, | 0, | 0, | 0, | 0, | 0, | 0, | 0, | 0, | 0]-> [0]; |
| [ 0, | 0, | 0, | 0, | 0, | 0, | 0, | 1, | 0, | 0, | 0, | 0, | 0, | 0, | 0, | 0]-> [0]; |
| [ 0, | 0, | 0, | 0, | 0, | 0, | 0, | 0, | 1, | 0, | 0, | 0, | 0, | 0, | 0, | 0]-> [0]; |
| [ 0, | 0, | 0, | 0, | 0, | 0, | 0, | 0, | 0, | 1, | 0, | 0, | 0, | 0, | 0, | 0]-> [0]; |
| [ 0, | 0, | 0, | 0, | 0, | 0, | 0, | 0, | 0, | 0, | 1, | 0, | 0, | 0, | 0, | 0]-> [0]; |
| [ 0, | 0, | 0, | 0, | 0, | 0, | 0, | 0, | 0, | 0, | 0, | 1, | 0, | 0, | 0, | 0]-> [0]; |
| [ 0, | 0, | 0, | 0, | 0, | 0, | 0, | 0, | 0, | 0, | 0, | 0, | 1, | 0, | 0, | 0]-> [0]; |
| [ 0, | 0, | 0, | 0, | 0, | 0, | 0, | 0, | 0, | 0, | 0, | 0, | 0, | 1, | 0, | 0]-> [0]; |
| [ 0, | 0, | 0, | 0, | 0, | 0, | 0, | 0, | 0, | 0, | 0, | 0, | 0, | 0, | 1, | 0]-> [0]; |
| [ 0, | 0, | 0, | 0, | 0, | 0, | 0, | 0, | 0, | 0, | 0, | 0, | 0, | 0, | 0, | 1]-> [0]; |
| [ 0, | 0, | 0, | 0, | 0, | 0, | 0, | 0, | 0, | 0, | 0, | 0, | 0, | 0, | 0, | 0]-> [1]; |
| [ 1, | 1, | 0, | 0, | 0, | 0, | 0, | 0, | 0, | 0, | 0, | 0, | 0, | 0, | 0, | 0]-> [1]; |
| [ 0, | 0, | 0, | 0, | 1, | 0, | 1, | 0, | 0, | 0, | 0, | 0, | 0, | 0, | 0, | 0]-> [1]; |
| [ 0, | 0, | 0, | 0, | 0, | 0, | 0, | 0, | 1, | 1, | 0, | 0, | 0, | 0, | 0, | 0]-> [1]; |
| [ 0, | 0, | 0, | 0, | 0, | 0, | 0, | 0, | 0, | 0, | 0, | 0, | 0, | 0, | 1, | 1]-> [1]; |
| [ 1, | 0, | 0, | 0, | 0, | 0, | 1, | 0, | 0, | 0, | 0, | 0, | 0, | 0, | 0, | 0]-> [1]; |
| [ 0, | 0, | 0, | 1, | 0, | 0, | 0, | 0, | 0, | 1, | 0, | 0, | 0, | 0, | 0, | 0]-> [1]; |
| [ 0, | 0, | 0, | 0, | 0, | 0, | 0, | 1, | 0, | 0, | 0, | 0, | 0, | 0, | 1, | 0]-> [1]; |
| [ 0, | 1, | 0, | 0, | 0, | 0, | 0, | 0, | 0, | 0, | 0, | 0, | 0, | 0, | 0, | 1]-> [1]; |
| [ 0, | 0, | 0, | 0, | 0, | 0, | 1, | 0, | 0, | 0, | 0, | 0, | 0, | 1, | 0, | 0]-> [1]; |
| [ 1, | 0, | 0, | 0, | 0, | 0, | 0, | 0, | 0, | 1, | 0, | 0, | 0, | 0, | 0, | 0]-> [1]; |
| [ 1, | 0, | 0, | 0, | 0, | 1, | 0, | 0, | 0, | 0, | 1, | 0, | 0, | 0, | 0, | 1]-> [1]; |
| [ 0, | 0, | 1, | 0, | 0, | 0, | 0, | 0, | 1, | 0, | 0, | 0, | 1, | 0, | 0, | 0]-> [1]; |
| [ 1, | 0, | 1, | 0, | 0, | 0, | 0, | 0, | 1, | 0, | 1, | 0, | 0, | 1, | 0, | 0]-> [1]; |
| [ 1, | 1, | 1, | 1, | 1, | 1, | 1, | 1, | 1, | 1, | 1, | 1, | 1, | 1, | 1, | 1]-> [1]; | end

In the code segment, logic states 210 provided to the error detection logic 202 are segmented into blocks of four inputs. Such segmenting into blocks of four inputs is unique to a particular construction of a PGA 200 according to the present invention. In such embodiment, segmenting of the logic states 210 into groups of four allows the error detection logic 202 to operate in an efficient and expeditious manner so as to produce the reset signal 211 in a timely fashion as compared to the speed of operation of the state machine logic 204. However, in other embodiments, it may prove prudent to segment the logic states 210 into groups of a differing size.

Table 1 below illustrates the signals produced by the error detection logic blocks 402A and 402B for a one-hot encoded PGA. As previously discussed, in a one-hot encoded PGA, when more than one state bit is logic high, or when none of the state bits is logic high, the PGA is in an illegal or erroneous state. Table 1 illustrates signals NOBITS and NORMT1B that are produced by the error detection logic blocks 402A and 402B in detecting illegal states. Error logic block 402A, for example, produces signal NOBITS as logic high when none of its inputs are logic high. Further, error logic block 402A produces signal NORMT1B as logic high when none of its inputs are logic high or more than one of its inputs are logic high.

TABLE 1

| NOBITS | NORMT1B | ASSOCIATED OPERATING CONDITION |
|---|---|---|
| 0 | 0 | 1 state bit set, therefore a legal state |
| 0 | 1 | More than one bit set, therefore an illegal state |
| 1 | 0 | Undefined, therefore an illegal condition |
| 1 | 1 | No bits set, therefore an illegal state |

Error detection block 402A generates signals $NOBITS_0$ and $NORMT1B_0$ based upon state machine bits $S_0$ through $S_3$. Further, error detection logic block 402B produces signals $NOBITS_1$ and $NORMTL1B_1$ based upon state machine bits $S_4$ through $S_7$. Additional error detection logic blocks are used as required so that each state machine bit generated by the state machine logic block 204 of FIG. 2 is received by one of the error detection logic blocks. Where the number of state machine bits is not divisible by the number of inputs of the lookup table of the error detection logic block, the LUTs of the respective error detection logic block are programmed to produce signals NOBITS and NORMT1B for the particular states machine bits received.

FIG. 4B illustrates an error detection logic block 420 at a next higher hierarchical level of the error detection logic 202 of FIG. 2 according to the invention. LUT 422A receives signals $NOBITS_0$, $NORMT1B_0$, $NOBITS_1$, and $NORMT1B_1$ generated by error detection logic blocks 402A and 402B of FIG. 4A and produces RESET signal 424. Since LUT 422B is not required for generating the RESET signal 424, in the particular case, the LUT 422B neither receives inputs nor generates outputs. In the example, the RESET signal 424 produced by the error detection logic block 422A is provided to the state machine logic block 204 of FIG. 2 to indicate an erroneous state.

Figure 5:
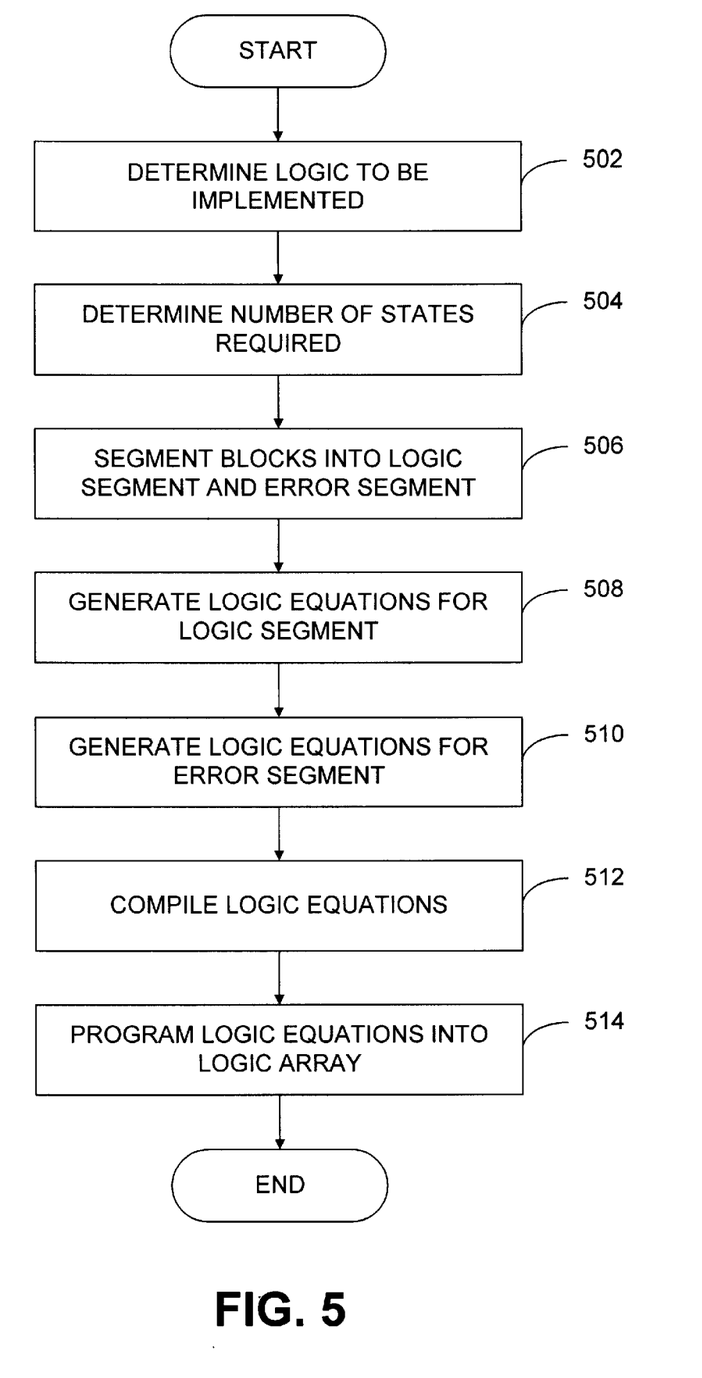
FIG. 5 is a flow diagram illustrating a method for programming and operating a PGA to implement error detection according to the present invention.

FIG. 5 illustrates the programming and implementation required to achieve the error detection logic and state machine logic according to the present invention. Operation starts at block 502 wherein the designer may determine a particular logical requirement to be executed by a programmable gate array. Typically, a designer chooses a programmable gate array to execute certain higher level functions defined by the designer. Certain higher level functions may be first initiated in a high level design language with the higher level functions then compiled to generate logical functions that may be employed with the PGA.

From step 502, operation proceeds to step 504 wherein the number of states to be required in the state machine logic is determined. In accordance with the previous description, in a one-hot encoded state machine, the number of states corresponds to the number of state machine bits determined for the state machine logic. Next, at step 506, the number of states and the logic are employed to segment the logic blocks present in the PGA into the state machine logic blocks and the error detection logic blocks as previously described with reference to FIG. 2.

Then, at step 508, the method includes generating logic equations for the state machine logic blocks of the state machine logic. Such logic equations, after programmed into the state machine logic blocks, will produce the desired outputs based upon the inputs provided to the state machine logic as well as the existent state of the state machine logic.

Then, at step 510, the method includes generating the logic equations for the error detection logic of the programmable gate array. As was previously described, the error detection logic receives the state machine bits from the state machine logic into its hierarchy to produce a reset signal based upon the state machine bits. The programming of particular logic blocks of the programmable gate array as well as the connections between the logic blocks causes the error detection logic to function correctly in determining erroneous states based upon the state machine bits.

Next, at step 512, the method includes compiling the logic equations generated at steps 508 and 510 into code that will be used to program the programmable gate array. Then, at step 514, the logic equations compiled at step 512 are programmed into the programmable gate array to implement the functionality of the state machine logic and the error detection logic as determined previously. Thus, in accordance with the system and methodology of the present invention, a PGA may be generated that operates at a high speed not only in generating outputs based upon inputs in previous states but that generates error conditions and associated reset signals at the same rate.

Figure 6:
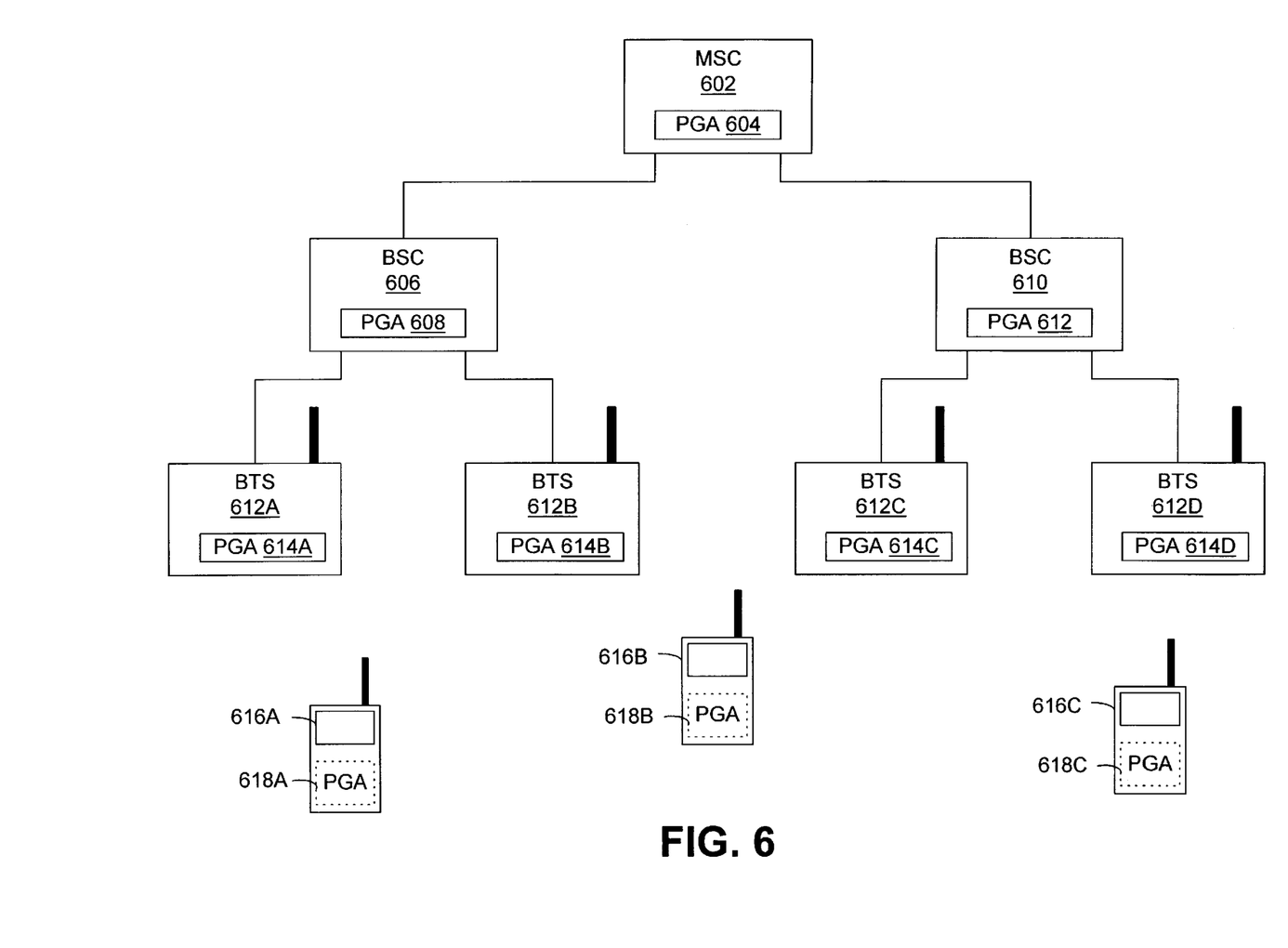
FIG. 6 is a block diagram illustrating a communication system having communication system elements that incorporate PGAs according to the present invention.

FIG. 6 illustrates a communication system within which PGAs constructed according to the present invention may be employed. For example, PGA 604 may be employed within mobile switching center (MSC) 602 while PGAs 608 and 612 may be employed within base station controllers (BSCs) 606 and 610, respectively. Further, PGAs 614A–614D may be used within base transceiver stations 612A–612D, respectively. Finally, PGAs 618A–618C may be used within portable terminals 616A–616C, respectively. In one particular implementation of a PGA according to the present invention includes the Nortel NTAX88CA Remote Module Time Switch Controller. However, PGAs according to the present invention could be implemented in many other communication system elements as well.

In view of the above detailed description of the present invention and associated drawings, other modifications and variations will now become apparent to those skilled in the art. It should also be apparent that such other modifications and variations may be effected without departing from the spirit and scope of the present invention as set forth in the claims which follow.

I claim:

1. A programmable gate array for executing logic functions, the programmable gate array comprising:

a plurality of state machine logic blocks, each state machine logic block producing a respective state having a plurality of state bits, the plurality of state machine logic blocks interconnected to execute the logic functions and, in combination, producing a system state that is one-hot encoded wherein, in non-error states, one bit of the plurality of state bits is logic one and remaining bits of the plurality of state bits state bits are logic zero;

a plurality of error detecting logic blocks, each of the plurality of error detecting logic blocks having a plurality of inputs, a first output and a second output, the first output being logic zero and the second output being logic zero when only one of the plurality of inputs is logic one;

the first output being logic zero and the second output being logic one when more than one of the plurality of inputs is logic one;

the first output being logic one and the second output being logic zero in an undefined illegal condition; and the first output being logic one and the second output being logic one when none of the plurality of inputs is logic one;

a first group of error detecting logic blocks receiving the states produced by the plurality of state machine logic blocks; and a second group of error detecting logic blocks receiving outputs produced by the first group of error detecting logic blocks and producing an error signal upon detection of an error in the system state.

2. The programmable gate array of claim 1, wherein:

each of the plurality of state machine logic blocks includes programmable logic and at least one state machine, each state machine producing a state bit; and each of the plurality of error detecting logic blocks includes at least one programmable logic unit, each programmable logic unit receiving at least one state bit.

3. The programmable gate array of claim 1, wherein each of the plurality of error detecting logic blocks has four inputs.

4. The programmable gate array of claim 1, the plurality of error detecting logic blocks detecting an error in the system state when more than one of the states produced by the plurality of state machine logic blocks is logic high.

5. The programmable gate array of claim 4, the plurality of error detecting logic blocks detecting an error in the system state when none of the plurality of state machine logic blocks is in a logic high state.

6. The programmable gate array of claim 1, the plurality of error detecting logic blocks connected in a multi-level hierarchy to produce the error signal.

7. The programmable gate array of claim 1, wherein the plurality of error detecting logic blocks further comprises:

a third group of error detecting logic blocks receiving outputs produced by the second group of error detecting logic blocks and producing the error signal.

8. The programmable gate array of claim 1, the plurality of error detecting logic blocks relaying the error signal to the plurality of interconnected state machine logic blocks to reset operation of the plurality of interconnected state machine logic blocks.

9. A communication system for providing communication among a plurality of users, the communication system comprising:

a plurality of interconnected network elements, the interconnected network elements in together providing communication among the plurality of users, at least one of the network elements having a programmable gate array including:

a plurality of state machine logic blocks, each state machine logic block producing a respective state having a plurality of state bits, the plurality of state machine logic blocks interconnected to execute the logic functions and, in combination, producing a system state that is one-hot encoded wherein, in non-error states, one bit of the plurality of state bits is logic one and remaining bits of the plurality of state bits state bits are logic zero;

a plurality of error detecting logic blocks, each of the plurality of error detecting logic blocks having a plurality of inputs, a first output and a second output the first output being logic zero and the second output being logic zero when only one of the plurality of inputs is logic one;

the first output being logic zero and the second output being logic one when more than one of the plurality of inputs is logic one;

the first output being logic one and the second output being logic zero in an undefined illegal condition; and the first output being logic one and the second output being logic one when none of the plurality of inputs is logic one;

a first group of error detecting logic blocks receiving the states produced by the plurality of state machine logic blocks; and a second group of error detecting logic blocks receiving outputs produced by the first group of error detecting logic blocks and producing an error signal upon detection of an error in the system state.

10. The communication system of claim 9, wherein in each of the programmable gate arrays:

each of the plurality of state machine logic blocks includes programmable logic and at least one state machine, each state machine producing a state bit; and each of the plurality of error detecting logic blocks includes at least one programmable logic unit, each programmable logic unit receiving at least one state bit.

11. The communication system of claim 9, wherein in each of the programmable gate arrays:

each of the plurality of error detecting logic blocks has four inputs.

12. The communication system of claim 9, wherein each of the plurality of error detecting logic blocks detects an error in the system state when more than one of the states produced by the plurality of state machine logic blocks is logic high.

13. The communication system of claim 12, wherein each of the plurality of error detecting logic blocks further detects an error in the system state when none of the states produced by the plurality of state machine logic blocks is logic high.

14. The communication system of claim 9, the plurality of error detecting logic blocks connected in a multi-level hierarchy to produce the error signal.

15. The communication system of claim 9, wherein the plurality of error detecting logic blocks further comprises:

a third group of error detecting logic blocks receiving outputs produced by the second group of error detecting logic blocks and producing the error signal.

16. The communication system of claim 9, the plurality of error detecting logic blocks relaying the error signal to the plurality of interconnected state machine logic blocks to reset operation of the plurality of interconnected state machine logic blocks.

17. In a programmable gate array having a plurality of logic blocks, a method for operating the programmable gate array to detect an error condition, the method comprising the steps of:

programming a first portion of the plurality of logic blocks as state machine logic blocks, each state machine logic block producing a respective state having a plurality of state bits, the plurality of state machine logic blocks interconnected to execute logic functions and, in combination, producing a system state that is one-hot encoded wherein, in non-error states, one bit of the plurality of state bits is logic one and remaining bits of the plurality of state bits state bits are logic zero;

programming a second portion of the plurality of logic blocks as error detecting logic blocks, each of the plurality of error detecting logic blocks having a plurality of inputs, a first output and a second output, the first output being logic zero and the second output being logic zero when only one of the plurality of inputs is logic one;

the first output being logic zero and the second output being logic one when more than one of the plurality of inputs is logic one;

the first output being logic one and the second output being logic zero in an undefined illegal condition; and the first output being logic one and the second output being logic one when none of the plurality of inputs is logic one;

dividing the plurality of error detecting logic blocks into a first group of error detecting logic blocks and a second group of error detecting logic blocks, the first group of error detecting logic blocks receiving the states produced by the plurality of state machine logic blocks; and the second group of error detecting logic blocks receiving outputs produced by the first group of error detecting logic blocks; and producing an error signal upon detection of an error in the system state by the error detecting logic blocks.

18. The method of claim 17, wherein each of the plurality of error detecting logic blocks has four inputs.

19. The method of claim 17, further comprising the step of:

resetting the state machine blocks upon detection of an error in the system state.

20. The method of claim 19, further comprising the step of:

determining that an error in the system state exists when more than one of the states produced by the plurality of state machine logic blocks is logic high; and determining that an error in the system state exists when none of the states produced by the plurality of state machine logic blocks is logic high.

* * * * *